(12) United States Patent
Hunter

(10) Patent No.: US 7,978,070 B2
(45) Date of Patent: Jul. 12, 2011

(54) TAMPER RESPONDENT ENCLOSURE

(75) Inventor: Stephen B. Hunter, Kinnesswood (GB)

(73) Assignee: W. L. Gore & Associates (UK) Ltd., West Lothian (GB)

( * ) Notice: Subject to any disclaimer, the term of this patent is extended or adjusted under 35 U.S.C. 154(b) by 559 days.

(21) Appl. No.: 11/547,544

(22) PCT Filed: Apr. 6, 2005

(86) PCT No.: PCT/GB2005/001318
§ 371 (c)(1),
(2), (4) Date: Aug. 5, 2008

(87) PCT Pub. No.: WO2005/098950
PCT Pub. Date: Oct. 20, 2005

(65) Prior Publication Data
US 2008/0284610 A1   Nov. 20, 2008

(30) Foreign Application Priority Data
Apr. 8, 2004 (GB) ................... 0407972.9

(51) Int. Cl.
*G08B 13/08* (2006.01)
(52) U.S. Cl. ............... 340/545.6; 340/691.1; 340/693.5
(58) Field of Classification Search .............. 340/506, 340/541, 584, 635, 691.1, 693.5, 693.6, 545.6; 713/194; 327/517; 361/747, 736
See application file for complete search history.

(56) References Cited

U.S. PATENT DOCUMENTS

| | | | | |
|---|---|---|---|---|
| 5,159,629 A | * | 10/1992 | Double et al. | 713/194 |
| 5,233,505 A | * | 8/1993 | Chang et al. | 361/785 |
| 5,858,500 A | * | 1/1999 | MacPherson | 428/68 |
| 6,233,339 B1 | * | 5/2001 | Kawano et al. | 380/44 |
| 6,264,108 B1 | * | 7/2001 | Baentsch | 235/487 |
| 6,438,825 B1 | * | 8/2002 | Kuhn | 29/830 |
| 6,496,119 B1 | | 12/2002 | Otterstedt et al. | 340/653 |
| 6,686,539 B2 | * | 2/2004 | Farquhar et al. | 174/525 |
| 7,054,162 B2 | * | 5/2006 | Benson et al. | 361/760 |
| 7,247,791 B2 | * | 7/2007 | Kulpa | 174/50 |
| 7,468,664 B2 | * | 12/2008 | Daughton et al. | 340/551 |
| 7,549,064 B2 | * | 6/2009 | Elbert et al. | 713/194 |
| 7,760,086 B2 | * | 7/2010 | Hunter et al. | 340/540 |
| 2002/0002683 A1 | | 1/2002 | Benson | 361/760 |

FOREIGN PATENT DOCUMENTS

| | | |
|---|---|---|
| DE | 197 38 990 A1 | 3/1999 |
| EP | 1 462 907 A | 9/2004 |
| FR | 2 801 999 A | 6/2001 |
| GB | 2 220 513 A | 1/1990 |
| GB | 2 256 956 A | 12/1992 |
| GB | 2 256 957 A | 12/1992 |
| GB | 2 256 958 A | 12/1992 |
| GB | 2 258 075 A | 1/1993 |

(Continued)

*Primary Examiner* — Toan N Pham
(74) *Attorney, Agent, or Firm* — Allan M. Wheatcraft

(57) ABSTRACT

The present invention relates to a tamper respondent covering (10) wherein the covering (10) is adapted for mounting on a surface having at least one item (14, 16) disposed thereon, said tamper respondent covering (10) comprising a covering member defining a recess (28), and at least one non-metallic detecting element having an electrical characteristic disposed on said covering member, wherein said covering member is adapted for mounting on the surface and covering and protecting said at least one item (14, 16) on the surface such that damage to said at least non-metallic detecting element results in a detectable variation to said electrical characteristic.

70 Claims, 4 Drawing Sheets

FOREIGN PATENT DOCUMENTS

| GB | 2 270 785 A | 3/1994 |
| GB | 2356 276 | 5/2001 |
| WO | WO 99/21142 | 4/1999 |
| WO | WO 01/59544 A2 | 8/2001 |

* cited by examiner

TAMPER RESPONDENT ENCLOSURE

FIELD OF THE INVENTION

The present invention relates to a tamper respondent covering.

BACKGROUND OF THE INVENTION

The applicant has previously proposed a variety of forms of tamper resistant enclosures, such as those described in U.S. Pat. No. 5,858,500, and UK Patent Applications 2220513, 2258075, 2256956, 2256957, 2256958 and 2270785, the disclosures of which are incorporated herein by reference.

These enclosures are in the form of envelopes and shallow boxes, the walls of which are formed by folding flexible sheets incorporating tamper detection features. Included in such sheets are layers of flexible material including a matrix of semi-conductive lines printed on thin insulating film. The matrix of lines forms a continuous conductor which is broken if attempts are made to penetrate the film. The circuit is monitored by opening the conductor at one point and measuring the resistance between the two ends of the circuit. The sheets are folded and overlapped to create an enclosure of wedge-shaped, cuboid or cube form, such as disclosed in GB 2 258 075 A in which a laminate is folded about a plurality of fold lines to form an enclosure. In U.S. Pat. No. 5,858,500 the envelope or box formed of the flexible sheet is potted in a settable material.

The enclosures are intended to surround an item to be protected, such as an electronic device, which may be an encryption module, chip or other circuit for processing, containing or carrying potentially valuable information. As noted above, any attempt to penetrate the enclosure results in damage to one or more of the lines, and this damage is detectable as a change in an electrical characteristic of the conductor. On detection of such a change the valuable information contained within the item is typically erased or destroyed and an alarm may be activated.

It may however be relatively time consuming and expensive to enclose and surround an item in such an enclosure. Also, the provision of an enclosure which completely surrounds an item places restrictions on the manner in which the item may be located and positioned within a larger device and is likely to, for example, preclude conventional surface mounting.

US Patent Application Publication No. US2002/0002683 A1 to Benson et. al. discloses a Security Module System comprising a cover which encloses the components to be protected and abuts the substrate, on which the said components are mounted, using a ball grid array connection system. The cover comprises a serpentine pattern of metallic conductors which may be interconnected with a pattern of metallic conductors embedded in the substrate by a system of plated through-holes and blind vias to form a three dimensional array of conductors surrounding the components being protected. To prevent the pattern and location of the metallic conductors being detected by non-destructive techniques such as X-rays, back planes of X-ray opaque material are laminated into the cover and the substrate.

Furthermore, to deter chemical attack on the system additional elements such as conductive ink fuses are provided on the substrate.

The system disclosed has a number of shortcomings in relation to resistance to intrusive attacks, for example the X-ray opaque backplane can be easily located and could be ground away or electrochemically etched to allow the underlying pattern of metallic conductors to be exposed by X-ray or other non-destructive techniques. Areas of the metallic conductors could then be effectively bridged by attaching wire links to the serpentine pattern of conductors and the cover or substrate penetrated without triggering the tamper respondent circuit.

Similarly, the vias in the side wall of the cover could be located and similarly bridged without triggering the tamper respondent circuit. The side walls are not protected by the pattern of serpentine conductors and therefore present an area susceptible to attack, as does the system of ball grid array interconnections.

It would also be possible by similar techniques to locate the positions of the conductive ink fuses on the circuit board and to direct a chemical attack at locations away from the fuses without triggering a tamper response.

The system disclosed teaches the protection of a complete board of components. In some cases it may be desirable to protect a small area of a board containing only one or a few items and this is not addressed by the referenced application. Indeed, given the complexity of the approach used it is unlikely that that this system could be effectively used to protect such small areas.

Preferred embodiments of the current invention are designed to address the aforementioned shortcomings.

SUMMARY OF THE INVENTION

According to a first aspect of the present invention there is provided a tamper respondent covering comprising a covering member including at least one non-metallic detecting element having an electrical characteristic, whereby damage to said at least one element results in a detectable variation to said electrical characteristic, the covering member defining a recess which may be pre-formed and generally conforming to the three dimensional profile of the item(s) to be protected.

The provision of the recess in the covering member facilitates use of the tamper respondent covering to protect surface-mounted items, as the covering member may be fixed to the surface with the item accommodated within the recess. The cover may alternatively be utilised together with another cover, and the covers secured together to define an enclosed volume. In one embodiment, a single covering member may be provided and may be foldable to bring portions of the covering member together and define a volume therebetween. In use, this covering member may wrap around a printed circuit or other substrate.

According to another aspect of the present invention there is provided a tamper respondent covering comprising a covering member including at least one non-metallic element having an electrical characteristic, the covering member being adapted for mounting to a surface and covering an item on the surface, whereby an attempt to penetrate the covering or separate the covering from the surface results in damage to said at least one element and a detectable variation in said electrical characteristic.

The invention also relates to methods of protecting an item on a surface by affixing a covering member of one of these aspects of the invention to a surface such that the item is located between the surface and the covering. The method may comprise the further step of monitoring one or more electrical characteristics of said element of the covering member.

The various aspects of the invention thus provide a convenient means for protecting surface mounted objects, such as IC packages mounted on printed circuit boards (PCBs), which may be rigid or flexible. If the covering member is cut, broken or separated from the surface, said element of the covering member may be damaged, which damage is readily detectable as a change in said electrical characteristic. The covering member may be mounted to the surface by any appropriate means, for example, by mechanical fasteners or by providing parts on the covering member for engaging with cooperating parts on the surface, such as providing male parts on the covering member which engage with corresponding female parts on or in the surface, or spring fingers or tongues which engage with openings or slots in the surface. Most preferably however, the covering member is bonded to the surface.

The bonding may be achieved by any appropriate means. For example, thermosetting adhesives comprising tapes or pads or thermosetting dispensible liquid adhesives, or combinations of both, may be used. Such adhesives may also be used in a bonding process in which the adhesives are subjected to a combination of heat and pressure to form a reliable bond (thermo-compression bonding). Such adhesives may also be cured or crosslinked by subjecting them to electromagnetic energy such as ultra-violet, visible, infrared, or microwave radiation. The covering to may also be bonded to the surface with thermoplastic (hot-melt) adhesives in the form of tape, pads or a bead. Pressure sensitive adhesives may also be used to bond the covering to the surface.

The thermoset, thermoplastic, or pressure sensitive adhesives may be electrically insulating or may comprise electrically conductive filler to render the adhesive electrically conductive throughout its bulk or anisotropically conductive through one axis only. A suitable anisotropic adhesive is the film adhesive designated product no 8085 available from the 3M Corporation. The tamper respondent covering may be bonded to the surface using a combination of both electrically insulating and electrically conductive adhesives.

The tamper respondent covering may also be bonded to the surface using the material which is utilised in the composition of the non-metallic element of the covering.

Mechanical clamping methods comprising frames clips and/or screws may also be used to attach the covering to the surface, which will typically be the surface of board. Such methods may also be used in conjunction with gaskets having selective electrically conductive areas to effect electrical connection between areas of the covering and selected areas on the surface.

In embodiments wherein the covering comprises a metallic layer such a covering may be bonded to the surface using solder or solder pastes.

Other methods, such as ultrasonic or laser welding or the like, known to one skilled in the art, may also be used to attach the covering to the surface.

Preferably, at least a perimeter of the covering member is adapted to be bonded to the surface. At least one element may extend around the perimeter of the covering member, which element is thus liable to damage by any attempt to, for example, separate a portion of the perimeter from the surface, which would be detectable by a sensor.

Preferably, an edge portion of the covering member is adapted to be folded to provide at least a double thickness at a perimeter of the covering member when fixed to the surface. The edge portion of the covering member may be configured to provide a consistent double-thickness when folded in this manner.

The covering member may be adapted for location on only one surface of a device or the like, or may be adapted to extend around or through a device and thus extend over another, typically oppositely directed, surface of the device. Thus, embodiments of the invention may be utilised to, for example, protect items on opposite faces of a PCB, or a covering member may be used to protect a chip on one face of a PCB and be fixed to the other face of the PCB.

The covering member may comprise one or more non-metallic elements. Where a plurality of elements is provided, each element may take a similar form or may take a different form. One or more elements may take the form of elongate electrical conductors formed of any appropriate material such as conductive or semi-conductive ink. One or more elements may take the form of conductive sheets forming layers or parts of layers of a laminated covering member.

Preferably, the one or more elements extend over substantially the whole area of the covering member.

Where a plurality of elements are provided it is preferred that the elements are arranged such that, in use, each element experiences substantially the same conditions, such as deformation or temperature variations. In one embodiment this is achieved by interdigitating the elements by, for example, providing the elements in overlapping and interlocking arrangements. This facilitates monitoring of the elements, as the changes in, for example, resistance of the elements due to elongation and temperature variations will tend to be consistent between the elements.

The electrical characteristic of the element may be one or more of resistance, capacitance, impedance, inductance or the like. In use, the element preferably forms part of a monitored electrical circuit across or through which a voltage or electrical signal is applied or transmitted. An attempt to penetrate the covering that alters said electrical characteristic may thus be detected as, for example, a change in the measured voltage across the element or a variation in a signal passed through the element. In a preferred embodiment the elements define four resistances of a bridge circuit, which has been found to provide enhanced sensitivity.

In a preferred embodiment the one or more elements comprise a plurality of conductive tracks, and most preferably conductors formed by a pattern of conductive ink tracks printed on one or both sides of a suitable substrate. The tracks may be in any appropriate pattern, such as serpentine, but are preferably rectilinear, such as a zigzag pattern. Preferably, the tracks comprise an appropriate carrier medium, for example polyester, loaded with conductive material, such as carbon. One desirable feature of such a system is that tracks are easily broken or dissolved by chemical attack. A further desirable feature of such a system is that the tracks are non-differentiable by X-ray imaging, by which is meant difficult to distinguish from adjacent material under X-ray imaging.

The composition of such tracks also makes it impossible for the tracks to be electrically bridged by soldered wire links as used to bridge metallic tracks.

It is desirable that the cohesive strength of the tracks be less than the adhesive strength to the covering, the surface to which the covering is mounted, or to the adhesive used to attach the covering to the surface; thus ensuring that any attempt to delaminate the covering will result in fracture of the tracks. The fracture of the tracks thereby being detectable by a sensor circuit as a change in electrical characteristic.

The resistivity of the tracks may be controlled by varying the nature and concentration of the conductive material.

Where the one or more elements comprise conductive tracks, the covering member may feature a protective coating or covering to, for example, prevent the creation of electrical connections between the elements and an item being protected.

The one or more elements may be provided on the face of the covering to be mounted to the surface. When the covering is adhered to the surface, any attempt to separate the covering from the surface will therefore disrupt or otherwise damage the elements. In other embodiments the one or more elements may be incorporated within the covering, and the covering adapted to delaminate or otherwise separate on an attempt to separate the covering member from the surface, such delamination disrupting or otherwise damaging the elements.

Preferably, the one or more elements are formed of tracks on both sides of a substrate, and are most preferably arranged to collectively provide substantially complete coverage or "blackout". The substrate may be transparent or otherwise light transmitting to facilitate alignment of the tracks on the opposite sides of the substrate during formation of the tracks.

Where one or more elements are provided on a face of the covering, or the elements are provided on a light-transmitting substrate, the elements are preferably obscured, for example by overprinting or otherwise covering the elements with a suitable material which bonds well to the elements. The material may be a pre-formed film, or may be a settable material applied over the elements either before or after the covering is applied to the surface. The material may be applied relatively thinly, or may be relatively thick, for example if applied over the covering member as a "glob-top". Where the elements are in the form of conductive ink tracks of carbon-loaded polyester the tracks may be obscured by a layer of black polyester. Where the obscuring material is a film, the film may include an element having an electrical characteristic, which characteristic may be monitored to provide a further means for detecting attempts to penetrate the covering member.

The covering member will typically take the form of a laminate of a thickness less than 1 mm and preferably less than 0.25 mm.

Typically the covering member may be stiff but may be flexible, such that the member may bend or flex to accommodate a non-planar mounting surface, or to allow edges or parts of the member to be folded around edges of a board or the like. In accordance with the first aspect of the invention, the covering member defines one or more recesses, which recesses may be dimensioned to accommodate items to be protected. The covering member may be dimensioned to extend over the entire surface of a selected device, such as a PCB, or may only extend over one or more items mounted on a PCB. The recess or recesses will typically have a depth of between 1 and 20 mm, and more preferably between 2 and 4 mm.

In one embodiment, the covering member is initially provided in planar form and is then deformed, by a combination of heat and pressure, to the appropriate form. Such deformation will typically involve corresponding deformation of the one or more elements, pre-formed on the covering member, which may alter the electrical characteristics of the elements; however, typically the elements are preferably arranged such that each element experiences a similar degree of deformation, and the electrical characteristics of the elements post-deformation are utilised as references. In alternative embodiments, the recess may be formed by folding an initially planar sheet form, rather than by thermoforming. Furthermore, the covering member may be initially formed including the recess, rather than subsequently reforming the member to create the recess.

Preferably, the covering is provided in combination with a sensing circuit. The covering member, and in particular the one or more elements, may be coupled to the sensing circuit in any appropriate manner. In a preferred embodiment, the one or more elements comprise surface contacts adapted to form electrical contact with corresponding surface contacts on the surface. Preferably, the contacts are adhered to one another by an appropriate conductive material, such as a Z-axis conductive adhesive, such that the appropriate electrical connection may be formed simultaneously with the covering member being bonded to the surface. In further embodiments the one or more elements are provided with an electrical connection means, such as a lead with which an electrical connection may be formed before the cover member is mounted to the surface, the cover member covering the connection.

Although reference is made primarily herein to elements having certain electrical characteristics, those of skill in the art will recognise that elements having other detectable characteristics, for example optical transmission characteristics, or surface acoustic wave propagation characteristics, may be utilised as an alternative or additional detection means.

The covering member is preferably optically opaque.

The covering member may be used with a metallised or otherwise treated cover to provide EMI shielding or ESD protection.

BRIEF DESCRIPTION OF THE DRAWINGS

These and other aspects of the present invention will now be described, by way of example, with reference to the accompanying drawings, in which.

DETAILED DESCRIPTION OF THE DRAWINGS

Figure 1:
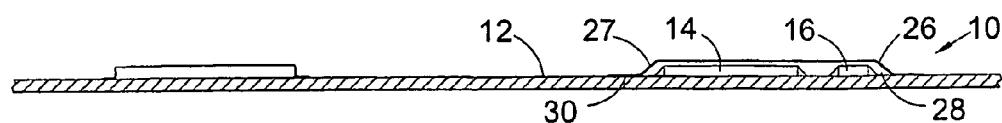
FIG. 1 is a schematic sectional view of a tamper respondent covering in accordance with an embodiment of the present invention shown mounted to a PCB and covering an item to be protected.

Reference is first made to FIG. 1 of the drawings, which illustrates a tamper respondent covering 10 in accordance with an embodiment of the present invention, the covering 10 being adhered to a PCB 12 to enclose devices 14, 16 mounted on the PCB 12. One of the devices 14 contains information, for example an encryption key, which it is desired to protect.

One of the devices is a sensing device 16 and is electrically coupled to the covering 10. Any attempt to pierce or cut the covering 10, or to peel the covering away from the PCB 12, to gain access to the devices 14, 16, will damage elements of the covering 10, which damage is detected by the sensing device 16. Immediately such damage is detected the sensing device 16 deletes or scrambles any valuable information stored on the device 14.

Figure 2:
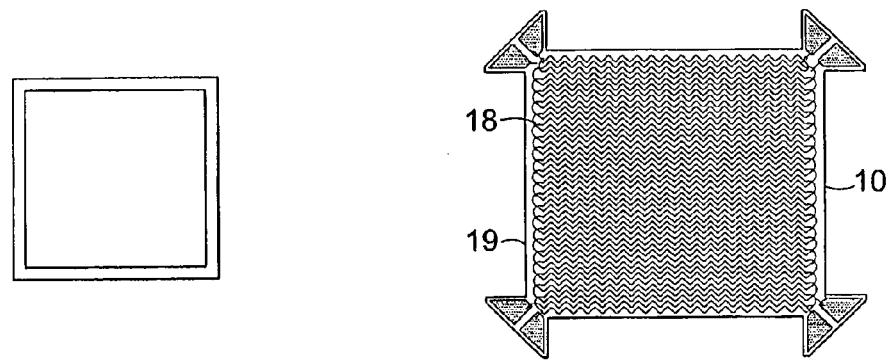
FIG. 2 is a view from below of the covering of FIG. 1, before being fixed to the PCB.
Figure 4:
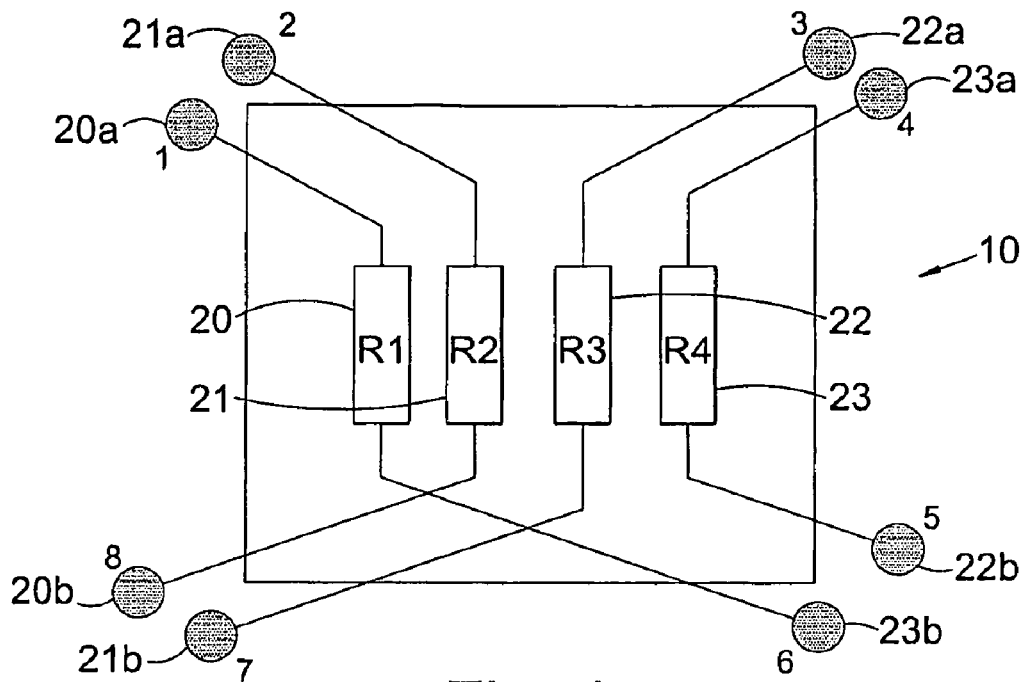
FIG. 4 is a schematic illustration of the covering of FIG. 1, showing electrical properties thereof.

The covering 10 of this embodiment is initially formed in a planar configuration by printing resistive ink tracks 18 onto both sides of a suitable flexible substrate 19, the substrate being formed of a material such as a polyester, for example PET. The substrate 19 may be laser-drilled at various points to permit electrical connections to be formed through the substrate 19. As is apparent from FIG. 2 of the drawings, the tracks 18 are printed in a tight rectilinear pattern and are arranged to provide complete coverage, or "blackout", such that any hole of relatively small dimensions will break or damage at least one track 18. As illustrated schematically in FIG. 4 of the drawings, the tracks 18 are arranged to define four conductors 20, 21, 22, 23 having resistances R1, R2, R3 and R4. Each conductor terminates in a pair of appropriate contacts 20a, 20b, 21a, 21b, 22a, 22b, 23a, and 23b.

Figure 3:
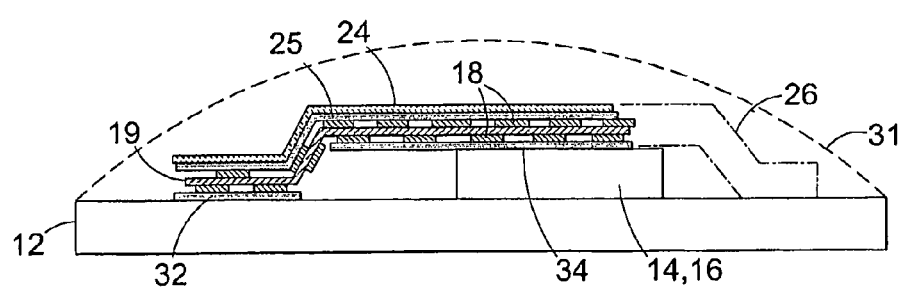
FIG. 3 is an enlarged and somewhat schematic sectional view of an edge area of FIG. 1.

The tracks 18 are formed of carbon-loaded polyester and are black in colour. The tracks 18 may thus be obscured by overprinting the tracks 18 with a thin layer of black polymer resin, or as illustrated in FIG. 3 by provision of an opaque cover film 24 which is fixed by adhesive 25 to the outer face of the substrate 19. The resulting planar laminate is then vacuum formed to form a recess or blister 26. In this example the blister 26 comprises a square central recess 28 within a square planar surround 30. The vacuum forming process will result in a degree of elongation of the tracks 18 at the step between the recess 28 and the surround 30, however with careful processing the electrical integrity of the tracks 18 is maintained.

The blister-form covering 10 is then adhered to the PCB 12, typically in a production-line situation, such that the surround 30, which carries portions of the tracks 18 on its surface, is firmly secured to the PCB 12 using an anistropic adhesive layer 32, which provides attachment and electrical connection in a single action; the contacts 20a-23b are folded under the covering 10 and adhered to corresponding contacts provided on the PCB 12, which couple the conductors 20-23 to the sensing device 16. A volume 31 of settable polymer resin is then deposited on the covering 10, extending over the upper surface of the covering 10 and onto the surrounding surface of the PCB 12.

The conductors 20-23 form a bridge circuit that is monitored by the sensing device 16. If the covering 10 is pierced or cut at least one of the tracks 18 will be damaged and the resulting change in resistance R1-R4 of the conductors 20-23 will be sensed. Similarly, if an attempt is made to peel the covering 10 from the PCB 12 the tracks on the surface of the surround 30 will be damaged and broken, allowing detection of the attempt to access the device 14 by the sensing device 16.

FIG. 3 illustrates the provision of an adhesive layer 34 to fix the covering 10 to the devices 14, 16 to improve thermal transfer. In other embodiments a protecting insulating film or the like, which may be a polymer film, such as polyamide, polyacrylate, polyalkene or polyester, may be provided on the underside of the covering 10 to ensure that the tracks 18 are electrically isolated from exposed conducting parts of the devices 14, 16.

The covering 10 thus provides a relatively simple and inexpensive means of protecting a surface-mounted item from unauthorised access, without the necessity to encapsulate an entire PCB or the like.

Figure 5:
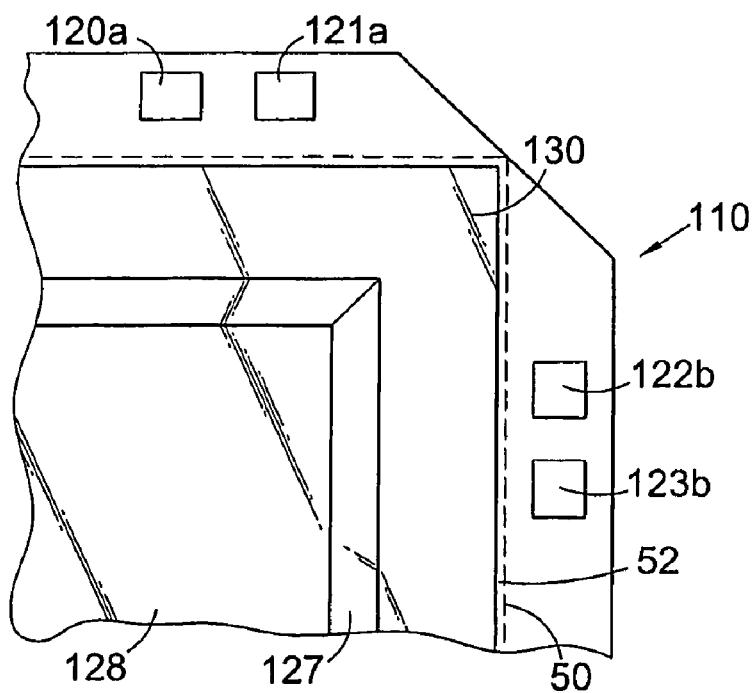
FIG. 5 is a schematic illustration of an edge of a covering according to a further embodiment of the present invention.

In other embodiments, the element contacts 120a-123b are formed as contacting pads on an upper edge portion of a surround 130, the edge of the surround being then folded under itself before bonding to the PCB. An edge portion of such a covering 110 is illustrated in FIG. 5 of the drawings, and it will be noted that when folded (along fold lines 50), the folded portion, which is adhered to itself to maintain the fold, is arranged to provide a consistent double-thickness at the perimeter. Also, the covering 110 includes a conductive perimeter-track 52, in addition to the interdigitated zigzag tracks (not shown), which forms a first line of defense in the event of an attack on the edge of the covering 110.

Figure 6:
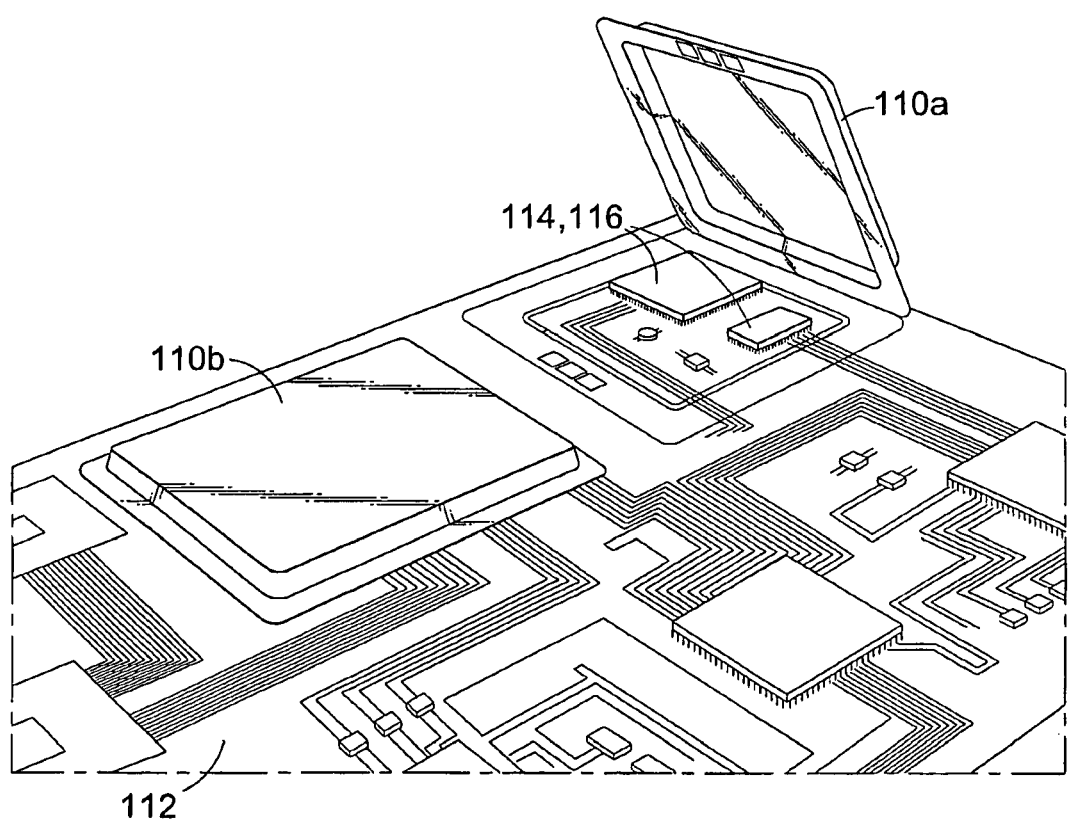
FIG. 6 is an isometric view of the coverings such as the covering of FIG. 5 mounted on a PCB.

Two such coverings 110 are shown in FIG. 6 of the drawings, the figure illustrating the coverings 110 fixed to a PCB 112 carrying various devices 114, 116.

Figure 7:
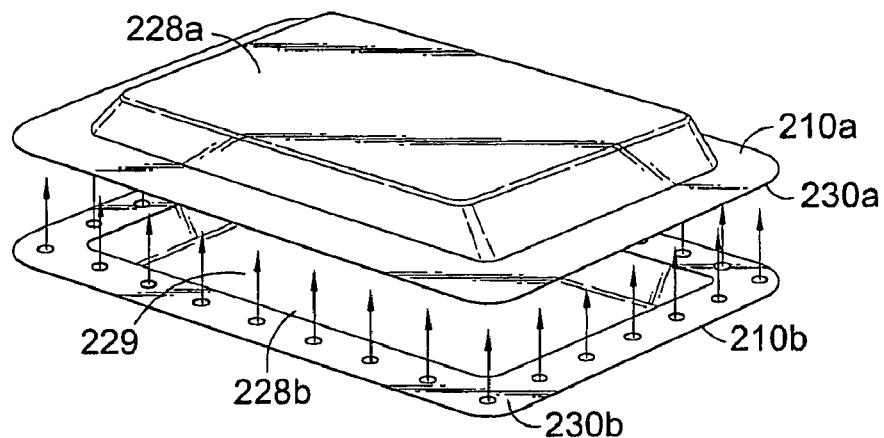
FIG. 7 is an isometric view of a tamper respondent covering in accordance with a further embodiment of an aspect of the invention.

Reference is now made to FIG. 7 of the drawings, in which two similar coverings 210a, 210b in the form of half shells are provided and are adapted to be fixed together such that the recesses 228a, 228b collectively define a volume 229 within which an item to be protected may be accommodated. Electrical continuity is provided between the elements of the coverings 210a, 210b by pad-to-pad contact at the planar surrounds 230a, 230b.

The half shells 210a, 210b may be retained together by any suitable means, including utilising the adhesive qualities of the conductive inks, using one or more of heat and pressure, or mechanical fasteners.

Figure 8:
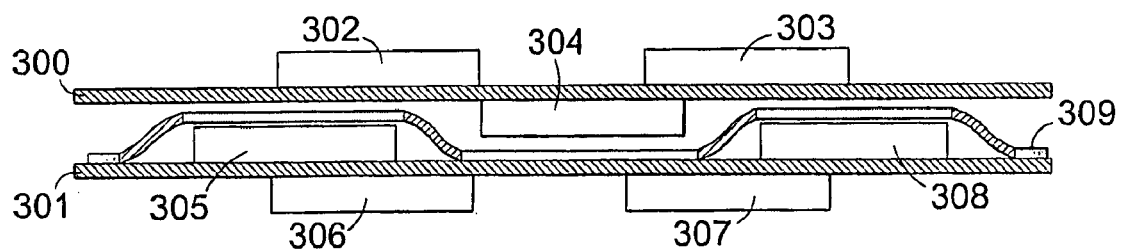
FIG. 8 is a representative two-dimensional view of two nested boards one of which includes an embodiment of the invention.

FIG. 8 illustrates the utility of the invention where boards containing mounted devices have to be stacked or nested to save space in a system.

Boards or cards 300, 301 carry the mounted devices 302, 303, 304, 305, 306, 307, 308. Tamper respondent covering 309 protects devices 305 and 308 from intrusion and due to its profiled form allows the top board 300 to be stacked closely against the bottom board 301 thereby minimising the space occupied by the two boards. Two boards are shown as a representation but it is obvious to one skilled in the art that it would be possible to stack a plurality of boards mounted with protected devices in this manner.

The invention has application in many areas where it is desired to protect an item, including devices or items utilised in financial transactions such as in banking, or in ticketing machines, or in devices concerned with measurement of a commodity, such as in meters for reading, recording or transmitting electricity, gas or water, or in many other devices including but not limited to encryption devices, set-top boxes, hand-held terminals, secure wireless communication devices, USB tokens, EPROMs\PROMs, secure authentication tokens, or part of PCMCIA card, or part of a motherboard or single board computer.

The invention claimed is:

1. A tamper respondent covering adapted for mounting on a surface having at least one item disposed thereon, said tamper respondent covering comprising a covering member defining a recess, and a planar surround surrounding said recess and adapted to be secured to the surface surrounding the at least one item, and at least one non-metallic detecting element having an electrical characteristic disposed on said covering member, wherein said planar surround is adapted for securing the covering member on the surface to locate the at least one item in the recess, thus covering and protecting said at least one item on the surface such that damage to said at least one non-metallic detecting element results in a detectable variation to said electrical characteristic.

2. The tamper respondent covering of claim 1, wherein the covering member generally conforms to a three dimensional shape of said item to be covered and protected.

3. The tamper respondent covering of claim 1, wherein the covering member is adapted for location on only one surface of a device.

4. The tamper respondent covering of claim 1, wherein the covering member is adapted to extend over two oppositely directed surfaces of a device.

5. The tamper respondent covering of claim 1 wherein said recess is a pre-formed recess.

6. The tamper respondent covering of claim 1 wherein said covering member comprises a plurality of pre-formed recesses.

7. The tamper respondent covering of claim 1 wherein said covering member is adapted to be bonded to the surface.

8. The tamper respondent covering of claim 7 wherein said covering is adapted to be bonded by an adhesive to the surface.

9. The tamper respondent covering of claim 8 wherein the adhesive is a thermoset adhesive.

10. The tamper respondent covering of claim 8 wherein the adhesive is a thermoplastic adhesive.

11. The tamper respondent covering of claim 8 wherein the adhesive is in the form of a tape or pad.

12. The tamper respondent covering of claim 8 wherein the adhesive is a dispensible fluid.

13. The tamper respondent covering of claim 8 wherein the adhesive is electrically insulating.

14. The tamper respondent covering of claim 8 wherein the adhesive is electrically conductive.

15. The tamper respondent covering of claim 14 wherein the adhesive is electrically conductive in one axis only.

16. The tamper respondent covering of claim 8 wherein said at least one detecting element has a cohesive strength and a bond between said detecting element and said bonding adhesive has an adhesive strength and said cohesive strength is less than said adhesive strength.

17. The tamper respondent covering of claim 1 wherein said covering is adapted to be mounted on the surface by mechanical clamping.

18. The tamper respondent covering of claim 1 wherein said covering is adapted to be mounted on to the surface by ultrasonically welding said covering to the surface.

19. The tamper respondent covering of claim 1 wherein said covering is adapted to be mounted on the surface by laser welding said covering to the surface.

20. The tamper respondent covering of claim 1 wherein said at least one detecting element has a cohesive strength and a bond between said detecting element and said covering member and a bond between said detecting element and said mounting surface each have an adhesive strength, and said cohesive strength is less than at least one of said adhesive strengths.

21. The tamper respondent covering of claim 1 wherein said at least one detecting element having an electrical characteristic is a conductive track.

22. The tamper respondent covering of claim 21, wherein the conductive track is of conductive ink.

23. The tamper respondent covering of claim 22, wherein the conductive ink comprises carbon.

24. The tamper respondent covering of claim 1, wherein at least one element extends over substantially the whole area of the covering member.

25. The tamper respondent covering of claim 1 wherein at least one element extends around a perimeter of the covering member.

26. The tamper respondent covering of claim 1, wherein a plurality of elements is provided and the elements is arranged such that, in use, each element experiences substantially the same conditions.

27. The tamper respondent covering of claim 26, wherein the elements are interdigitated.

28. The tamper respondent covering of claim 1, wherein the electrical characteristic of the at least one element is selected from at least one of resistance, capacitance, inductance and impedance.

29. The tamper respondent covering of claim 1, wherein the at least one element defines at least one resistance of a bridge circuit.

30. The tamper respondent covering of claim 1, wherein the at least one element comprises a plurality of conductive tracks.

31. The tamper respondent covering of claim 30, wherein the at least one element comprises a pattern of conductive ink tracks printed on at least one side of a substrate.

32. The tamper respondent covering of claim 30, wherein the at least one element comprises a pattern of conductive ink tracks printed on both sides of a substrate.

33. The tamper respondent covering of claim 30, wherein the tracks define a serpentine pattern.

34. The tamper respondent covering of claim 30, wherein the tracks are rectilinear.

35. The tamper respondent covering of claim 34, wherein the tracks are of a zigzag pattern.

36. The tamper respondent covering of claim 1, wherein the at least one element comprises at least one conductive track and the covering member further comprises an insulating layer to prevent the creation of electrical connections between the element and an item being protected.

37. The tamper respondent covering of claim 1, wherein the at least one element is incorporated within the covering, and the covering adapted to de-laminate or otherwise separate on an attempt to separate the covering member from the surface, thereby disrupting the conductive element.

38. The tamper respondent covering of any of claim 1, wherein the at least one element comprises tracks on both sides of a substrate arranged to collectively provide substantially complete coverage of the substrate.

39. The tamper respondent covering of claim 1, wherein the at least one element is provided on a face of the covering member and the element is obscured by covering the element with an obscuring material.

40. The tamper respondent covering of claim 39, wherein the obscuring material comprises a pre-formed film.

41. The tamper respondent covering of claim 40, wherein the film includes an element having an electrical characteristic, which characteristic may be monitored to provide a further means for detecting attempts to penetrate the covering member.

42. The tamper respondent covering of claim 39, wherein the obscuring material comprises a settable material applied over the element.

43. The tamper respondent covering of claim 1, wherein the covering member is flexible.

44. The tamper respondent covering of claim 1, wherein the covering member is a non-metallic laminate.

45. The tamper respondent covering of claim 1 wherein the at least one element is non-differentiable by X-ray imaging.

46. The tamper respondent covering of claim 1, wherein the at least one element comprises a carrier medium loaded with conductive material.

47. The tamper respondent covering of claim 46 wherein the carrier medium comprises a polymeric resin and the conductive material comprises carbon.

48. The tamper respondent covering of claim 47 wherein the polymeric resin comprises a polyester.

49. The tamper respondent covering of claim 1, wherein the covering member is dimensioned to extend over only one or more selected items mounted on a PCB.

50. The tamper respondent covering of claim 1, wherein the covering member is dimensioned to extend over the complete surface of a PCB.

51. The tamper respondent covering of claim 1, wherein the recess has a depth of between 1 and 20 mm.

52. The tamper respondent covering of claim 51, wherein the recess has a depth of between 2 and 4 mm.

53. The tamper respondent covering of claim 1, wherein the covering member is initially provided in planar form and is then deformed, by a combination of heat and pressure, to the appropriate form.

54. The tamper respondent covering of claim 1, wherein the at least one element is adapted to be coupled to a sensing circuit.

55. The tamper respondent covering of claim 1, wherein the covering member is combined with at least one other covering to provide at least one of EMI shielding and ESD protection.

56. The tamper respondent covering of claim 1 wherein the device or item to be protected is a component of a financial transaction system.

57. The tamper respondent covering of claim 1 wherein the device or item to be protected is a component of a ticketing system.

58. The tamper respondent covering of claim 1 wherein the device or item to be protected is a component of commodity measurement system.

59. The tamper respondent covering of claim 1 wherein the device or item to be protected is a component of an encryption device.

60. The tamper respondent covering of claim 1 wherein the device or item to be protected is a component of a television set-top box.

61. The tamper respondent covering of claim 1 wherein the device or item to be protected is a component of a hand held terminal.

62. The tamper respondent covering of claim 1 wherein the device or item to be protected is a component of a secure wireless communication system.

63. The tamper respondent covering of claim 1 wherein the device or item to be protected is a component of a USB token.

64. The tamper respondent covering of claim 1 wherein the device or item to be protected is a PROM.

65. The tamper respondent covering of claim 64 wherein the device or item to be protected is an EPROM.

66. The tamper respondent covering of claim 1 wherein the device or item to be protected is a secure authentication token.

67. The tamper respondent covering of claim 1 wherein the device or item to be protected is a component of PCMCIA card.

68. The tamper respondent covering of claim 1, further comprising a substrate having at least one item to be protected on at least one surface thereof.

69. The tamper respondent covering of claim 1, further comprising a sensor operatively associated with said at least one detecting element.

70. A method of protecting a surface mounted item or device comprising the steps of:
providing a covering member defining a pre-formed recess and a planar surround surrounding said recess and adapted to be secured to the surface surrounding the at least one item, and including at least one non-metallic detecting element having an electrical characteristic;
mounting the covering member on the surface such that the object is positioned in the recess;
forming an electrical circuit including said non-metallic detecting element; and
monitoring for detectable changes to said circuit, whereby said detectable changes activate a system to erase information contained in the protected device.

* * * * *